United States Patent

Stein et al.

Patent Number: 5,404,067
Date of Patent: Apr. 4, 1995

[54] BONDED PIEZOELECTRIC BENDING TRANSDUCER AND PROCESS FOR PRODUCING THE SAME

[75] Inventors: Christian Stein, Munich; Thomas Möckl, Coburg, both of Germany

[73] Assignee: Siemens Aktiengesellschaft, Munich, Germany

[21] Appl. No.: 249,693

[22] Filed: May 26, 1994

Related U.S. Application Data

[63] Continuation of Ser. No. 16,096, Feb. 10, 1993, abandoned.

[30] Foreign Application Priority Data

Aug. 10, 1990 [DE] Germany .................. 40 25 436.4

[51] Int. Cl.⁶ ........................................ H01L 41/08
[52] U.S. Cl. .................................. 310/330; 310/331; 310/363; 310/364
[58] Field of Search ................. 310/330–332, 310/363–365

[56] References Cited

U.S. PATENT DOCUMENTS

| | | | |
|---|---|---|---|
| 3,891,873 | 6/1975 | Yamagisawa et al. | 310/364 |
| 4,363,993 | 12/1982 | Nishigaki et al. | 310/332 |
| 4,649,312 | 3/1987 | Robin et al. | 310/330 |
| 4,756,808 | 7/1988 | Utsumi et al. | 204/180.2 |
| 4,833,659 | 5/1989 | Geil et al. | 310/332 |
| 4,849,668 | 7/1989 | Crawley et al. | 310/328 |
| 4,964,302 | 10/1990 | Grahn et al. | 73/865.7 |
| 5,083,056 | 1/1992 | Kondou et al. | 310/332 |
| 5,230,924 | 7/1993 | Li | 427/229 |

FOREIGN PATENT DOCUMENTS

| | | |
|---|---|---|
| 0388027 | 9/1990 | European Pat. Off. |
| 2425268 | 12/1975 | Germany |
| 3046535 | 8/1981 | Germany |
| 62-237780 | 10/1987 | Japan |
| 2189933 | 11/1987 | United Kingdom |

OTHER PUBLICATIONS

International Search Report.

Primary Examiner—Thomas M. Dougherty
Attorney, Agent, or Firm—Herbert L. Lerner; Laurence A. Greenberg

[57] ABSTRACT

A piezoelectric bending transducer includes two piezoceramic layers each having two sides and electrodes on both of the sides. A graphite fiber layer is glued between the piezoceramic layers with an epoxy resin. The graphite fiber layer has a greater length than the two piezoceramic layers defining an exposed part of the graphite fiber layer. A copper foil is glued to the exposed part. The copper foil has an area for disposition of a solder contact. A process for producing a bending transducer includes placing a graphite fiber layer impregnated with incompletely hardened epoxy resin between two polarized piezoceramic layers. The graphite fiber layer is glued between the piezoceramic layers upon hardening of the epoxy resin. A copper foil is glued onto the graphite fiber layer, preferably simultaneously with the gluing of the two piezoceramic layers.

4 Claims, 1 Drawing Sheet

BONDED PIEZOELECTRIC BENDING TRANSDUCER AND PROCESS FOR PRODUCING THE SAME

This application is a continuation of application Ser. No. 08/016,096, filed Feb. 10, 1993, now abandoned.

CROSS-REFERENCE TO RELATED APPLICATION

This application is a Continuation of International Application Ser. No. PCT/DE91/00616, filed Jul. 31, 1991.

SPECIFICATION

The invention relates to a piezoelectric bending transducer with a graphite fiber layer that is glued with an epoxy resin between two piezoceramic layers which are provided with electrodes on both sides. It also relates to a process for producing such a piezoelectric bending transducer.

If such an electromagnetic bending transducer is firmly fastened at one end and has a magnetic head at the other end, then when a voltage is applied to the bending transducer, the magnetic head will be deflected by a distance corresponding to the voltage. In that structure, the bending transducer can then be used in magnetic recording and reproducing equipment, such as in videocassette recorders. Another field of use for a bending transducer besides video technology is valve technology or Braille readers.

As a rule, piezoelectric bending transducers include two piezoceramic chips or layers that are glued to both sides of a metal or plastic foil, which may also be fabric-reinforced. The ceramic chips are provided with a metallization on both sides. Before or after being glued to the metal or plastic foil they are polarized to make a bimorph. In that process they are placed in an electrical field of 700 V/mm, for instance, and made piezoelectric in that way. If a potential of 170 V, for example, is then applied to the inner electrodes of the two piezoceramic chips and a potential of 0 V is applied to the two outer electrodes, then an electrical field is created which has opposite directions in the upper and lower ceramic chips. As a result of the piezoelectric effect, one piezoceramic chip will becomes longer and the other will become shorter. The bending transducer therefore bends. It can thus be used as an electromechanical adjusting element and its fields of application are, for example, those given above.

A piezoelectric bending transducer of the type referred to at the outset above is known from German Published, Non-Prosecuted Application DE 30 46 535 A1. In that bending transducer, it is not a layer of metal or plastic but rather a layer of graphite or carbon fiber that is disposed between the two piezoceramic layers. The individual carbon fibers are embedded in an epoxy resin. It is particularly significant that in that electromagnetic transducer, the carbon fibers extend in the same direction, or in other words are all disposed parallel to one another. The individual graphite fibers are placed in such a way that they extend parallel to the direction in which the electromechanical transducer is to expand or contract to generate the deflection. It is assumed that it is in that direction that the graphite fiber layer has its greatest modulus of elasticity. The modulus of elasticity is substantially less at right angles to that direction. The piezoelectric ceramic slabs may, for example, be made from a lead-zirconate-titanium ceramic. The bending transducer is dimensioned as being virtually square. Nothing is said in that disclosure about the bonding of the various electrodes.

The same piezoelectric bending transducer, with a carbon fiber layer placed between two piezoceramic layers, is known from U.S. Pat. No. 4,363,993 of Nishigaki et al. In that piezoelectric bending transducer, the operating voltage is applied only to the outer electrodes. The inner electrodes lack external terminals.

U.S. Pat. No. 4,363,993 and German Published, Non-Prosecuted Application DE 30 46 535 A1 are both based on the same Japanese priority applications.

A piezoelectric bending transducer is known from Abstract JP 62-237780, in Patent Abstracts of Japan, Vol. 12, No. 108, E597, that has a conductive elastic intermediate layer which is provided with an electrical contact. However, nothing is known about the material of which that intermediate layer is made and in what way the bonding of the intermediate layer was achieved.

It is accordingly an object of the invention to provide a bonded piezoelectric bending transducer and a process for producing the same, which overcome the hereinafore-mentioned disadvantages of the heretofore-known products and processes of this general type, in which the bonding of the inner electrodes of the two piezoceramic layers can be carried out in a reliable and simple way, and accordingly in which providing the electrical connection does not entail an overly great effort or expense.

With the foregoing and other objects in view there is provided, in accordance with the invention, a piezoelectric bending transducer, comprising two piezoceramic layers each having two sides and electrodes on both of the sides; a graphite fiber layer being glued between the piezoceramic layers with an epoxy resin; the graphite fiber layer having a greater length than the two piezoceramic layers defining an exposed or free part of the graphite fiber layer; and a copper foil glued to the exposed part, the copper foil having an area for disposition of a solder contact.

Accordingly, the graphite fiber layer is used as a common electrode and is provided with an electrical terminal for the two electrodes located on the inside. This can be carried out relatively simply.

In accordance with another feature of the invention, the copper foil has a pretreated surface of rough structure, being oriented toward the graphite fiber layer, in order to make the contact between the copper foil and the graphite fiber layer particularly good.

In accordance with a further feature of the invention, the surface of the copper foil is covered with a rough layer of a material selected from the group consisting of tin, nickel and copper.

With the objects of the invention in view, there is also provided a process for producing a bending transducer, which comprises placing a graphite fiber layer impregnated or saturated with incompletely hardened epoxy resin between two polarized piezoceramic layers; gluing the graphite fiber layer between the piezoceramic layers upon hardening of the epoxy resin; and gluing a copper foil onto the graphite fiber layer, preferably simultaneously with the gluing of the two piezoceramic layers.

In accordance with another mode of the invention, there is provided a process which comprises pretreating the copper foil by covering the copper foil with a thin, rough metal layer before gluing the copper foil onto the graphite fiber layer.

In accordance with a further mode of the invention, there is provided a process which comprises pretreating the copper foil by covering the copper foil with a thin, rough metal layer selected from the group consisting of zinc and nickel applied by electrolytic deposition before gluing the copper foil onto the graphite fiber layer.

In accordance with a concomitant mode of the invention, there is provided a process which comprises pretreating the copper foil by covering the copper foil with a thin, rough copper layer applied by electrolytic deposition at high current density before gluing the copper foil onto the graphite fiber layer.

Other features which are considered as characteristic for the invention are set forth in the appended claims.

Although the invention is illustrated and described herein as embodied in a bonded piezoelectric bending transducer and a process for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
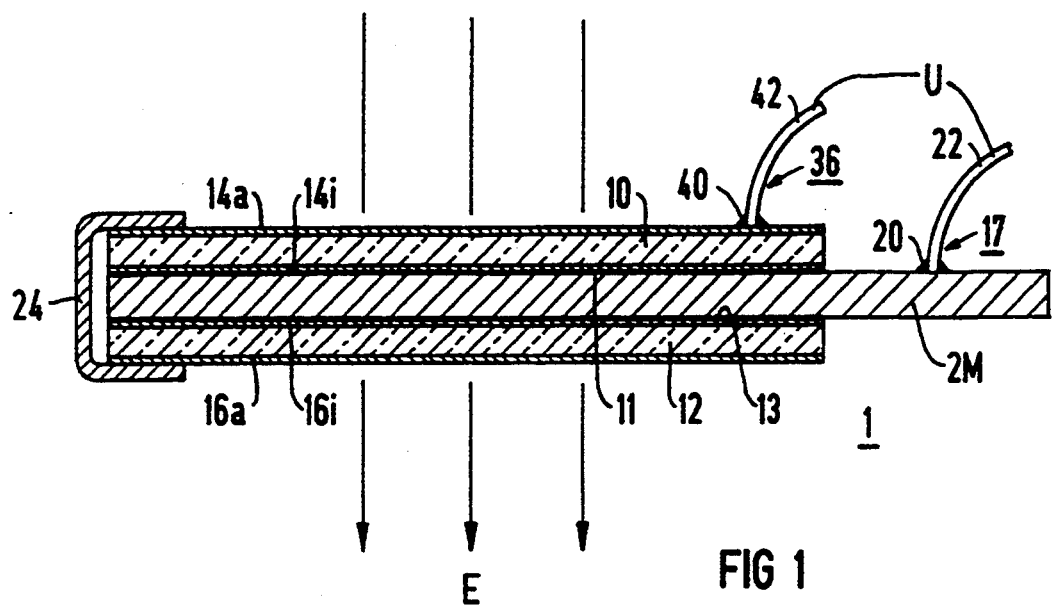
FIG. 1 is a diagrammatic, longitudinal-sectional view of a piezoelectric bending transducer with a brass foil being used as an inner layer, for the sake of more clearly illustrating the problem presented.

Referring now to the figures of the drawing in detail and first, particularly, to FIG. 1 thereof, there is seen a bending transducer 1 which includes a metal foil or metal layer 2M, onto both sides of which piezoceramic chips or layers 10, 12 are glued. The piezoceramic layers 10, 12 are provided with metallizations or electrodes on both sides. Inner electrodes are marked with reference symbols 14$i$, 16$i$ and outer electrodes are marked with reference symbols 14$a$, 16$a$. Relatively thick layers 11 and 13, which include an adhesive, are respectively located between the layer 2M and the layers 10 and 12. The metal foil 2M, which in particular may be formed of brass, is somewhat longer toward the right end than the two piezoceramic layers 10, 12, defining an exposed region. Located in the exposed region is an electrical terminal 17 having a soldering point 20, to which a connecting wire 22 leads. Correspondingly, an electrical connection 36 with a soldering point 40 and a connecting wire 42 is provided on the upper outer electrode 14$a$. On the left end, a metal bracket 24 assures contact of the two outer electrodes 14$a$, 16$a$ with one another.

Before or after being glued, the ceramic chips 10, 12 are polarized, by being placed in an electrical field E of 700 V/mm, for instance, and thus made piezoelectric. Upon application of a voltage U to the connecting or feed wires 22, 42, the bending transducer 1 bends.

The structure shown in FIG. 1 with a brass foil 2M as the inner layer has the advantage that the metallizations 14$i$, 16$i$ located on the inside of the piezoceramic layers 10, 12 can be bonded in a simple manner. This is because the adhesive layers 11, 13 can be selected to be so thin that points and bumps, which are always present because of the rough surface of the ceramic layers 10, 12, penetrate the adhesive 11, 13 at many points, thus producing a reliable contact between the metal foil 2M and the metallization layers 14$i$, 16$i$ on the inside. Additionally, the wires 22, 42 can easily be soldered for purposes of further electrical wiring.

However, the structure with the brass foil 2M has grave disadvantages as well. First, brass is difficult to glue and second, brass and piezoceramic have quite different coefficients of thermal expansion. As a result, tensile or compressive strains arise in the piezoceramic layers 10, 12 as a function of the gluing temperature and the temperature of use. If gluing is carried out at room temperature and if the bending transducer 1 is heated in the equipment in which it is incorporated, then tensile strains arise in the piezoceramic layers 10, 12, and the ceramic will crack. On the other hand, if gluing is carried out at a higher temperature, such as 130° C., then even though one can be certain that the bending transducer is hardly likely to be exposed to higher temperatures during use, nevertheless the ceramic layers 10, 12 will be under compressive strain. If a ceramic layer 10, 12 that has already been prepolarized has been glued, then the mechanical strains cause depolarization and therefore an attenuation of the piezo effect. The bending will also be less.

Metal layers 2M having a coefficient of thermal expansion that is adapted to the ceramic layers 10, 12 are usually not usable, because of their vulnerability to corrosion. Moreover, they lend themselves poorly to soldering, so that attaching further wiring becomes difficult again.

In contrast, if the glued sandwich is polarized, then the ceramic layer 10, 12 cracks. The polarization in fact involves an alignment of domains in the particles of the ceramic layers 10, 12. This produces a shape change, because of the crystallographic anisotropy of the piezoceramic layers 10, 12. The ceramic chip 10, 12 that is affected becomes shorter and thicker. Since it is firmly glued to the brass sheet 2M, it cannot contract and accordingly cracks.

Figure 2:
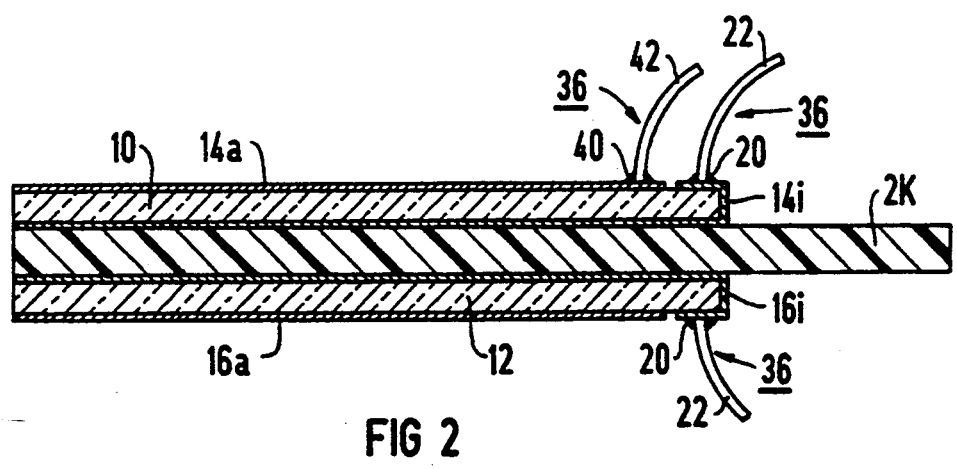
FIG. 2 is a longitudinal-sectional view of a piezoelectric bending transducer with a plastic foil being used as the inner layer, again for more clearly illustrating the problem presented.

FIG. 2 shows that in principle a plastic foil 2K can also be used instead of a metal foil 2M. In that case, bonding the inner electrodes 14$i$, 16$i$ becomes difficult, because they border a nonconductive plastic of the foil 2K. In that case, the inner metallizations 14$i$, 16$i$ can be extended upward and downward over an edge (shown on the right in FIG. 2) of the applicable piezoceramic layer 10, 12, to enable bonding. This then produces two bonding points 36. This all involves major effort and expense technologically.

Figure 3:
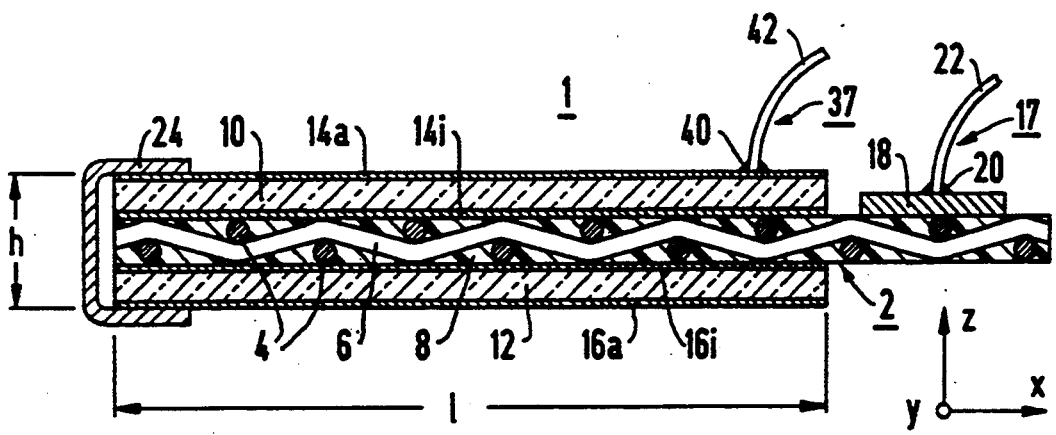
FIG. 3 is a longitudinal-sectional view of a piezoelectric bending transducer according to the invention.

FIG. 3 shows a piezoelectric bending transducer in which the bonding problems discussed above are counteracted.

In FIG. 3, the piezoelectric bending transducer 1 includes a graphite fiber layer 2 as its essential element, which includes carbon fibers 6 extending in a longitudinal direction x, carbon fibers 4 extending in a transverse direction y at right angles thereto, as well as epoxy resin 8. The various carbon fibers 4 and 6, which are woven together with one another, thus form a carbon fiber fabric, which is saturated with the epoxy resin 8. Constructing the graphite fiber layer 2 as a fabric with crosswise fibers 4 and 6 lends the layer adequate stability. The graphite fiber layer 2 is glued between the two thin piezoceramic chips or layers 10, 12, which are provided with the electrodes 14a, 14i and 16a, 16i on both respective sides.

A length 1 of the bending transducer 1 measured in the longitudinal direction x is greater, by at least a factor of 3, than a width b thereof measured in the direction y at right angles thereto. For example, the bending transducer 1 may have a length l=80 mm measured in the x direction, a width b=2 mm measured in the y direction, and a height h=1 mm measured in a z direction. The graphite fiber layer 2 is longer than the two ceramic layers 10 and 12, which are of equal lengths, defining an exposed region. In the exposed region (located on the right), the layer 2 is provided with the electrical terminal 17. In the present exemplary embodiment, the terminal 17 is a copper foil 18 being glued onto the graphite fiber layer 2 and having an area on its surface for the soldering point or bond 20 of solder, to which the electrical connecting wire 22 is carried.

On the left side, the bending transducer 1 has the bracket 24 of metal, which electrically connects the two outer electrodes 14a, 16a of the respective piezoceramic layers 10 and 12 to one another.

Elongated slabs of lead-zirconate-titanium ceramic (PZT layers) are used in particular as the piezoceramic layers 10, 12. Preferentially, piezoceramic layers 10, 12 that have a positive temperature response of the piezo constant, which in the range from −20° C. to +60° C. is equal to or greater than 3.5% °/K, are used. Preferably, the temperature response in this range is between 4 and 7% °/K. The strongly positive temperature response means that as the temperature increases, the distortion of the ceramic layers 10, 12 and therefore the bending effect also increase. With increasing temperature, the epoxy resin 8 in the layer 2 becomes increasingly soft. This effect is compensated for by the aforementioned positive temperature response of the piezo material, so that the blocking force of the piezoelectric bending transducer 1 remains practically constant at all operating temperatures.

The electrodes 14a, 14i, 16a, 16i on the piezoceramic layers 10 and 12 are thin noble metal layers, having a thickness which is only 50 to 100 nm, for example. It is advantageous to employ a layer buildup in the following order: Cr-Pt-Au.

The following remarks can be made about the production of the bending transducer 1: The point of departure with the prior art is a carbon fiber fabric with crosswise fibers 4, 6, which is saturated with epoxy resin 8 that has not yet hardened fully. Such a material is in what is known as the B state, and the material is also known as a prepreg. This prepreg is excellently suited for being joined to the piezoceramic chips or layers 10, 12 in the form in which they are needed for the bending transducer 1. This prepreg has a coefficient of thermal expansion that is well, or maximally, adapted to the piezoceramic. Hot gluing with prepolarized piezoceramic can therefore be carried out, without causing later mechanical strains in the sandwich that would cause depolarization of the piezoceramic or cracks. In summary, it can be said that the prepreg material 4, 6, 8 is placed in the as-yet not fully hardened state between the two polarized piezoceramic layers 10, 12 and glued there upon the hardening of the epoxy resin 8.

In order to harden the epoxy resin 8 and to firmly glue to the two layers 10, 12, the temperature may, for instance, be increased. The temperature upon hardening and gluing may, for instance, be approximately 130° C.

Experiments have shown that the electrical conductivity of the carbon fiber fabric 4, 6 is fully adequate for the delivery of potential, and the bonding with the inner electrodes 14i, 16i of the two piezoceramic layers 10, 12 is even more intimate than with a metal foil instead of the graphite fiber layer 2, because an additional surface structure is afforded by the type of weave.

As is shown in FIG. 3, the problem of bonding the hardened carbon fiber fabric 2 can be solved as follows: In the region which is not covered by the piezoceramic layers 10, 12 and on which the contact 17 to the inner electrodes 14i, 16i is to be made, the copper foil 18 is laminated onto the prepreg 2. This process takes place simultaneously with the gluing of the two piezoceramic layers 10, 12 to the graphite fiber layer 2. The prepreg furnishes the adhesive, because in accordance with a prerequisite or condition of the invention, it contains epoxy resin 8 that has not yet hardened fully. The jargon term for this is "lamination".

In order to attain good adhesion of the copper foil 18 to the layer 2, it is practical to use a copper foil 18 having a surface to be glued which is pretreated. Such pretreatment may include applying electrolytically precipitated zinc or nickel, which produces a rough surface. A rough, readily gluable surface can also be obtained on the copper foil 18 electrolytically by depositing copper at high current density.

The solder support point 17 which is shown as including the copper foil 18, has excellent solderability, and the electrical contact with the carbon fiber fabric 2 is reliable and has low impedance.

A further solder support point 37 is provided on the outer electrode 14a. It includes the soldering point or bond 40 with the connecting wire 42.

We claim:

1. A piezoelectric bending transducer, comprising:
   two piezoceramic layers each having two sides and electrodes on both of said sides;
   a conductive elastic intermediate layer in the form of a graphite fiber layer glued between said piezoceramic layers with an epoxy resin for forming an electrically conductive contact between said electrodes and said graphite fiber layer;
   said graphite fiber layer having a greater length than said two piezoceramic layers defining a projection part of said graphite fiber layer projecting outwardly from between said piezoceramic layers; and
   a copper foil glued to said projecting part, said copper foil having an area for disposition of a solder contact for defining said graphite fiber layer as a common electrode.

2. The bending transducer according to claim 1, wherein said copper foil has a pretreated surface facing toward said graphite fiber layer.

3. The bending transducer according to claim 2, wherein said surface of said copper foil is covered with a rough layer of a material selected from the group consisting of zinc, nickel and copper.

4. The bending transducer according to claim 1, wherein said graphite fiber layer is a fabric having carbon fibers between which said epoxy resin is disposed.

* * * * *